United States Patent

Kondoh et al.

Patent Number: 5,260,586
Date of Patent: Nov. 9, 1993

[54] OPTICAL EXCLUSIVE-OR ELEMENT

[75] Inventors: Hiroshi Kondoh; Kiyoshi Yamaguchi; Yasuhiro Osawa, all of Sendai, Japan

[73] Assignees: Ricoh Company, Ltd., Tokyo; Ricoh Research Institute of General Electronics Co., Ltd., Miyagi, both of Japan

[21] Appl. No.: 976,326

[22] Filed: Nov. 13, 1992

[30] Foreign Application Priority Data

Nov. 18, 1991 [JP] Japan ................ 3-302100
Feb. 21, 1992 [JP] Japan ................ 4-035218

[51] Int. Cl.⁵ ........................................ H01L 27/14
[52] U.S. Cl. ........................ 257/84; 257/85; 257/95; 257/96; 257/97; 307/311
[58] Field of Search ........ 257/80, 85, 84, 81, 257/82, 83, 94, 95, 96, 97, 184; 365/110, 114, 195, 112, 111; 307/311

[56] References Cited

U.S. PATENT DOCUMENTS

| | | | |
|---|---|---|---|
| 4,202,000 | 5/1980 | Carballes | 257/85 |
| 4,806,997 | 2/1989 | Simmons et al. | 307/311 |
| 4,910,571 | 3/1990 | Kasahara et al. | 257/96 X |
| 5,130,762 | 7/1992 | Kulick | 257/85 |
| 5,184,247 | 2/1993 | Schimpe | 372/50 X |

FOREIGN PATENT DOCUMENTS

| | | |
|---|---|---|
| 59-117179 | 7/1984 | Japan . |
| 61-159776 | 7/1986 | Japan . |
| 62-15865 | 1/1987 | Japan . |
| 63-222474 | 9/1988 | Japan . |
| 3-213833 | 9/1991 | Japan . |
| 3-274030 | 12/1991 | Japan . |

OTHER PUBLICATIONS

Matsuda et al., "Integration of InGaAsP/InP Optoelectronic Bistable Switches with a Function of Optical Erasing," *IEEE Electron Device Letters*, vol. 11, No. 10, Oct. 1990, pp. 442-444.

Taylor et al., "Experimental Realization of an N-Channel Double Heterostructure Opto Electronic Switch," *Appl. Phys. Lett.* 48(20), May 19, 1986, pp. 1368-1370.

*Primary Examiner*—William Mintel
*Attorney, Agent, or Firm*—Mason, Fenwick & Lawrence

[57] ABSTRACT

An optical EXCLUSIVE-OR element in which the number of basic elements is reduced which results in increased integration of the element. The optical EXCLUSIVE-OR element comprises a substrate, a first optical functional element and a second optical functional element having the same structure as that of the first optical functional element. Each of the first and second optical functional elements has a light receiving portion and a light emitting portion. The light emitting portion is formed on the light receiving portion. The light emitting portion comprises semiconductor materials having an energy gap wider than the dominant peak energy of the input light, and the light receiving portion comprises semiconductor materials having an energy gap equal to or narrower than the dominant peak energy of the input light. A first electrode is formed over the first and second optical functional elements, and has windows which allow the input light and output light to pass through. Each of the windows being formed at a position corresponding to a top surface of each of the first and second optical functional elements.

15 Claims, 13 Drawing Sheets

OPTICAL EXCLUSIVE-OR ELEMENT

BACKGROUND OF THE INVENTION

The present invention relates to an optical functional element having a function of EXCLUSIVE-OR useful for optical information processing, that is, an optical EXCLUSIVE-OR element.

As a conventional integrated optical functional element for EXCLUSIVE-OR, as shown in FIG. 1, there is suggested an InGaAsP-type optical logic element having a structure where two optical erasable photonic parallel memories (OEPPM) 103 (refer to IEEE Electron Device Letters, VOL.11, No. 10, pp. 442–444, 1990, K. Matsuda et al.) are connected in parallel (refer to IEJCE Technical Report, QQE90-156, Adachi, Matsuno, Chino, Shibata). The above mentioned OEPPM 103 comprises an equivalent circuit, as shown in FIG. 1, having a heterojunction-type phototransistor (HPT) 102 as a basic structural element and a photonic parallel memory (PPM) element 101, connected in parallel. FIG. 2 is a schematic plan view of an example of the above mentioned element. In this element, two OEPPMs 103a and 103b each OEPPM comprising the PPM element 101 and the HPT 102 connected in parallel, are adjacently provided on the same substrate. Two HPT-PPT portions, independently biased, are arranged as they are located side by side. The element has four input or input-output windows indicated by shaded areas in FIG. 2.

Two output lights are output when a first input light 105 is incident upon the input window of each of the PPM 101a and HPT 102b, and a second input light 106 is incident upon the input window of each of the PPM 101b and HPT 102a. By superimposing these two lights so as to perform an OR operation, eventually, an EXCLUSIVE-OR can be obtained.

However, with an EXCLUSIVE-OR element of this structure, each of the first light 105 and the second light 106 are required to be supplied to a different window. Additionally, because the results of the EXCLUSIVE-OR operation are not output from one window, an alignment of an optical system is not easily maintained. Further, a space for four elements is required to perform one EXCLUSIVE-OR operation, which is a disadvantage for integration due to a large number of basic elements to be used. Furthermore, the manufacturing process becomes complex due to a fact that it is needed to form adjacent elements, each of which has a different layer structure.

FIG. 3 is a partially cutaway view of an element structure suggested by the applicant in Japanese Laid-Open Patent Application No.3-274030.

The optical functional element is formed, in turn, with a first conduction-type semiconductor substrate 111, a first conduction-type semiconductor layer (emitter layer) 112 having an energy gap wider than that of the substrate 111, a second conduction-type semiconductor layer (base layer) 113 having an energy gap wider than that of the emitter layer 112, and a first conduction-type semiconductor layer (collector layer) 114 having an energy gap the same as that of the base layer 113. The emitter layer 112, the base layer 113, and the collector layer 114 comprise a light receiving portion 122. On the collector layer 114, a first conduction-type semiconductor layer 115 having an energy gap wider than that of the substrate 111 and a second conduction-type semiconductor layer 116 having an energy gap the same as that of the layer 115 are, in turn, provided to form a light emitting portion 123. On the light emitting portion 123, a second conduction-type semiconductor layer (cap layer) 117 and a second electrode 118 are, in turn, provided. The reverse side of the substrate 111 is provided with a first electrode 110. Additionally, an optical input-output window 119 is provided on the second electrode 118 and the cap layer 117 so that the semiconductor layer 116 is exposed through the window 119.

As used above, the optical functional element designates an optoelectronic integrated functional element having an optical feedback, which element comprises a structure having alternately repeated layers of a first conduction-type semiconductor and a second conduction-type semiconductor, such as a pnpn structure or a npnp structure. Hereinafter, the optic-electronic integrated functional element is called an optical functional element.

A power source is connected to the optical functional element via a proper load resistor and a light is supplied to the optical functional element. FIGS. 4–6 are graphs showing relationships between light input and light output. The vertical axis and the horizontal axis of each graph represent the light intensity of the optical output and light input respectively. The operation mode of the relationship between optical input and output changes depending upon the resistance of the load resistor, the voltage of the power source, the inherent internal resistance of the element and the optical feedback rate. FIG. 4 is a graph showing the relationship between light input and output when the element is in an optical memory mode, FIG. 5 is in a optical bistable mode, FIG. 6 is in an optical differential gain mode. A light is emitted from the same input-output window 119 in the above three modes.

In the optical memory mode, the element is turned on when a light exceeding certain intensity is input, and the on-state is maintained even if the light input then becomes zero. In the optical bistable mode, the element has a characteristic such that the relationship between a light input and a corresponding light output during an increase of the light input is different from that during a decrease of the light input. In the optical differential gain mode, a small amount of change intensity of a light input results in a large amount of change in intensity of a light output. The operation of such modes is called threshold operation and logic operation including Boolean OR and AND can be executed.

However, in order to complete a logic operation, inverting logic operations such as NOT and EXCLUSIVE-OR (XOR) are needed. EXCLUSIVE-OR is represented by the following logic equation using AND, OR and NOT( ).

A xor B=(NOT(A) and B) or (A and NOT(B)).

The above mentioned logic operation element for EXCLUSIVE-OR which comprises a combination of OEPPMs is a realization of this logic equation. However, the problems in element structure and alignment of an optical system exist as formerly mentioned.

SUMMARY OF THE INVENTION

It is a general object of the present invention to provide an improved optical EXCLUSIVE-OR element in which the above mentioned disadvantages are eliminated.

A more specific object of the present invention is to provide an optical EXCLUSIVE-OR element in which the number of basic elements required to comprise EXCLUSIVE-OR is reduced in order to reduce the size which results in increased integration of an integrated circuit using the element.

Another object of the present invention is to provide a simplified manufacturing process of an optical EXCLUSIVE-OR element by having its basic elements use almost the same layer structure.

A further object of the present invention is to provide an optical EXCLUSIVE-OR element which enables simplification of alignment of an external optical system for supplying an input light.

In order to achieve the above mentioned objects, an optical EXCLUSIVE-OR element according to the present invention comprises:

a substrate;

a first optical functional element formed on the substrate, having a light receiving portion receiving an input light and a light emitting portion emitting an output light, the light emitting portion being formed on the light receiving portion, the light emitting portion comprising semiconductor materials having an energy gap wider than the dominant peak energy of the input light, the light receiving portion comprising semiconductor materials having an energy gap equal to or narrower than the dominant peak energy of the input light, the relationship between the input light and the output light being non-linear because of an optical feed back effect due to absorption of a portion of the output light emitted by the light emitting portion by the light receiving portion;

a second optical functional element formed in a position adjacent to the first optical functional element on the substrate, having the same structure as the first optical functional element; and a first electrode formed over the first and second optical functional elements, having windows which allow the input light and output light to pass through, each window being formed at a position corresponding to the top surface of one of the first and second optical functional elements.

Other objects, features and advantages of the present invention will become more apparent from the following detailed descriptions when read in conjunction with the accompanying drawings.

BRIEF DESCRIPTION OF THE DRAWINGS

FIG. 13A is a plan view; and FIG. 13B is a cross sectional view;

DETAILED DESCRIPTION OF THE PREFERRED EMBODIMENTS

Figure 7:
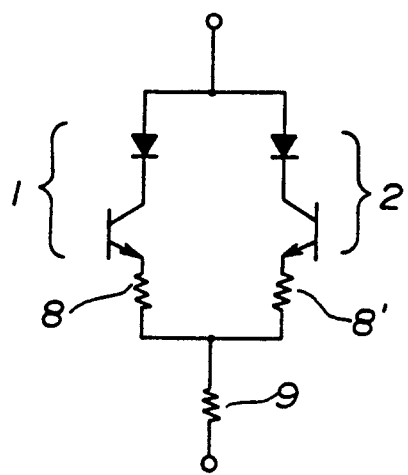
FIG. 7 is a circuit diagram of an equivalent circuit of an optical EXCLUSIVE-OR element according to the present invention.

FIG. 7 is a circuit diagram of an equivalent circuit of an optical EXCLUSIVE-OR element according to the present invention. In the circuit of FIG. 7, a resistor 8 is connected to a first optical functional element 1 in series and a resistor 8' is connected to a second optical functional element 2 in series. These sets, each comprising the optical functional element and the resistor, are connected in parallel and a commonly used resistor 9 is connected to the resistor side. When a light is incident upon the second optical functional-element 2 to cause it to go the on-state after supplying certain electric current to the element and maintaining the first optical functional element 1 in the on-state by inputting a light, the supply voltage to the first optical functional element 1 is reduced.

Figure 8:
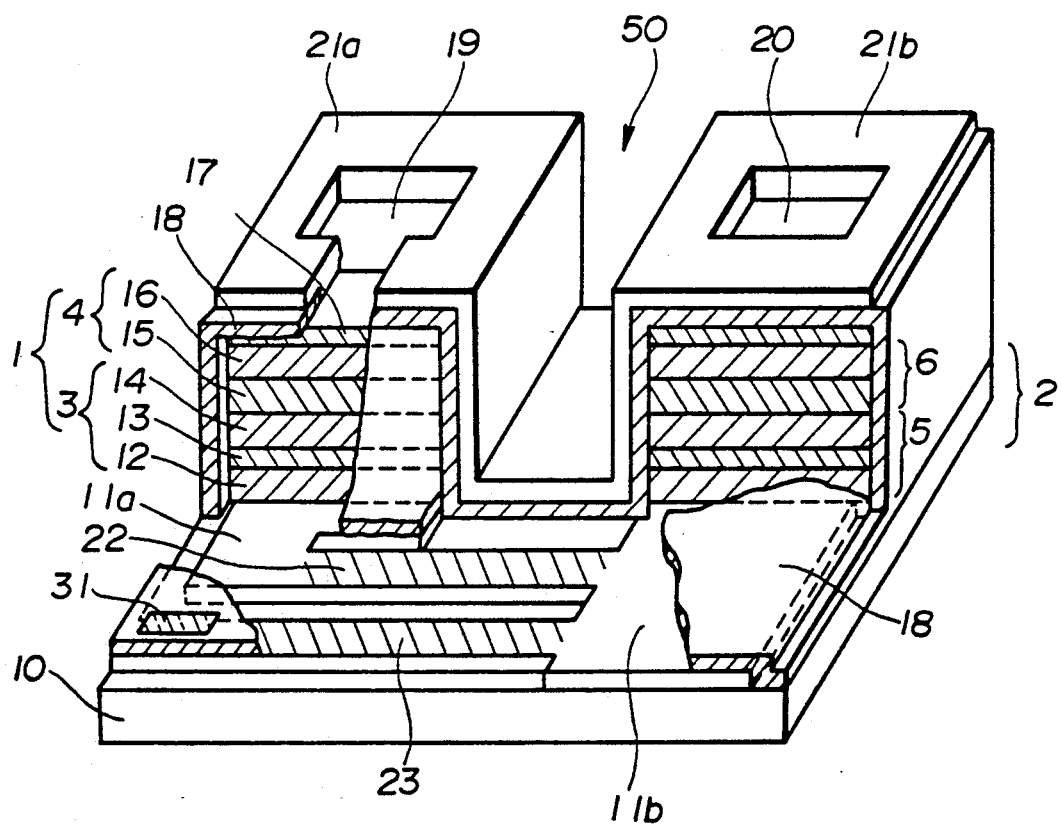
FIG. 8 is a partially cutaway perspective view of the basic structure of the optical EXCLUSIVE-OR element according to the present invention.

The present invention is based on the equivalent circuit of FIG. 7. FIG. 8 is a partially cutaway perspective view of the basic structure of the optical EXCLUSIVE-OR element according to the present invention. As shown in FIG. 8, the first optical functional element 1 includes, in turn, a semi-insulation semiconductor substrate 10, a resistor layer 11 having an energy gap the same as the substrate 10, a first conduction-type semiconductor layer (emitter layer) 12 having an energy gap wider than that of the resistor layer 11, a second conduction-type semiconductor layer (base layer) 13 having an energy gap narrower than that of the emitter layer 12, and a first conduction-type semiconductor layer (collector layer) 14 having an energy gap the same as that of the base layer 13. The emitter layer 12, the base layer 13, and the collector layer 14 comprise a light receiving portion 3. On the collector layer 14, a first conduction-type semiconductor layer 15 having an energy gap wider than that of the substrate 10 and a second conduction-type semiconductor layer 16 having an energy gap the same as that of the layer 15 are, in turn, provided to form a light emitting portion 4. On the light emitting portion 4, a second conduction-type semiconductor layer 17 having an energy gap the same as that of the substrate 10, an insulation layer 18 and a second electrode 21a are, in turn, provided. The second electrode 21a is also provided to the layer 17, and a light input-output window 19 is formed on the second electrode 21a and the layer 17 that allows the layer 16 of the light emitting portion 4 to be exposed to the outside through the window 19.

Additionally, a layer structure the same as that of the first optical functional element 1 is provided so as to form the second optical functional element 2 on a portion of the substrate 10 near the first optical functional element 1. The resistor layers 11a and 11b formed on the substrate 10 are connected to each other by a belt-like resistor region 22 having a resistance fixed to a value somewhere between 0 and 100 Ω, which region corresponds to the resistor 8 in the above mentioned equivalent circuit. Further, a resistor region 23, which corresponds to the resistor 9 of the above mentioned equivalent circuit, is formed extending from other portion of the resistor layer 11b. Although the insulation layer 18 is also formed on the resistor region 23, a portion of the resistor region 23 is exposed and a first electrode 31 is formed on that portion. Additionally, since a groove 50 is provided, which bottom surface reaches to a top surface of the substrate 10, between the optical functional elements 1 and 2, the upper portions of the semiconductor layer structure including resistor layers 11a, 11b is separated. It should be noted that the second electrodes 21a and 21b are connected by a metal layer provided on the side and bottom surfaces of the groove 50.

It should be noted that portions of the elements 1 and 2 and the insulation layer 18 on the resistor layer 11 are cutaway in order to show the layer structure and the plane structure of the resistor layer 11.

Next, an operation of optical EXCLUSIVE-OR which is able to be performed by the above mentioned structure according to the present invention will be given below.

In FIG. 8, an analog light beam $2P_{IN}$ is equally divided into two light beams and each of the two light beams $P_{IN}$ is respectively supplied to the first and the second optical functional elements through the input-output windows 19 and 20. Each functional element 1 and 2 is switched to the on-state by a different threshold value, namely $T_1$ and $T_2$ respectively ($0<T_1<T_2$). In case the two element structures show the same threshold value at the same intensity of light, those different threshold values are realized by having a filter between the input power source and one of the elements. Alternatively, the different threshold values are obtained by having the opening area of the window 20 smaller than that of the window 19, which serves as an iris for the input light, and by applying a light beam having a diameter greater than the diameter of each opening.

Figure 9:
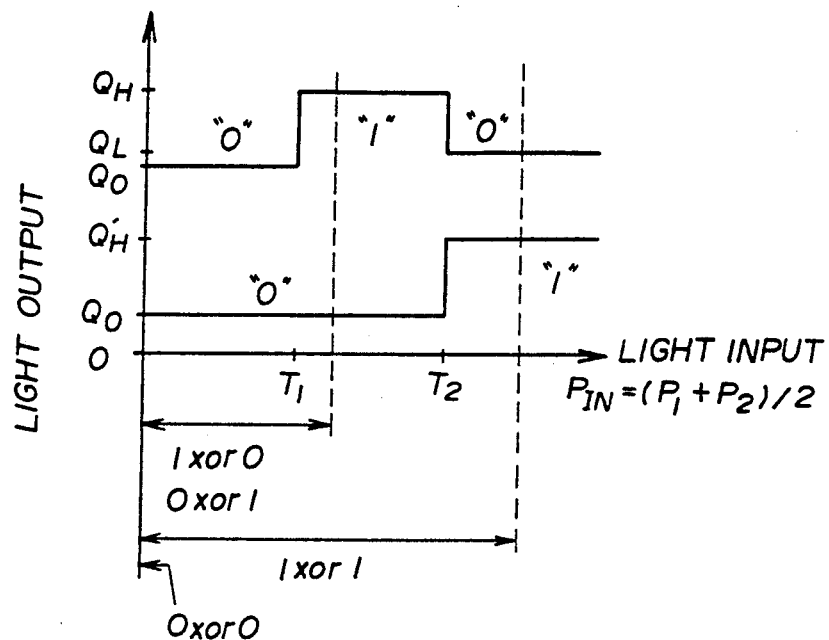
FIG. 9 is a graph showing input-output characteristics of the element.

FIG. 9 is a graph showing input-output characteristics of the element when the resistor 8, 9 and the input power source shown in FIG. 7 are selected so that the first and the second optical functional elements 1 and 2 can operate in the optical memory mode.

In FIG. 9, when the input light $P_{IN}$ is lesser than the first threshold value, both the first and the second functional elements 1 and 2 are in off-state and their output light intensity is 0 (=$Q_0$). On the other hand, when the input light $P_{IN}$ is such that $T_1 \leq P_{IN} < T_2$, the first functional element 1 alone is turned on and a light output $Q_H$ is emitted. Additionally, when the light input $P_{IN}$ is such that $T_2 \leq P_{IN}$, the second functional element 2 is also turned on and an electrical current flows in the second element 2. For this reason, the voltage drops between the two ends of the first functional element 1, causing reduction of the electric current and decrease of the intensity of the light output. This light output of the first functional element 1 is set to $Q_L$. Therefore, by properly setting the value of load resistors 8, 8' and 9 and the supply voltage of the power source, the contrast ratio $Q_H/Q_L$ (on-off ratio) of the light output of the first functional element 1 can be properly increased; that results in a realization of binary output.

As shown in FIG. 9, since the light output of the first functional element 1 does not become completely 0, the contrast ratio has a limit, for example, $Q_H:Q_L=3:1$. However, the higher the ratio of $Q_H/Q_L$ the more useful is the element and the ideal condition is obtained when $Q_L$ is 0. In the following description of a third embodiment, a method for improving the contrast ratio by means of improved structure of the element will be explained. However, even by that method, $Q_L$ does not become 0. On the other hand, the inventors of the present invention have confirmed by an experiment that an ideal operation can be realized by the invention's method of use without improving the element structure. Following is a description of the invention's principle and method.

Figure 1:
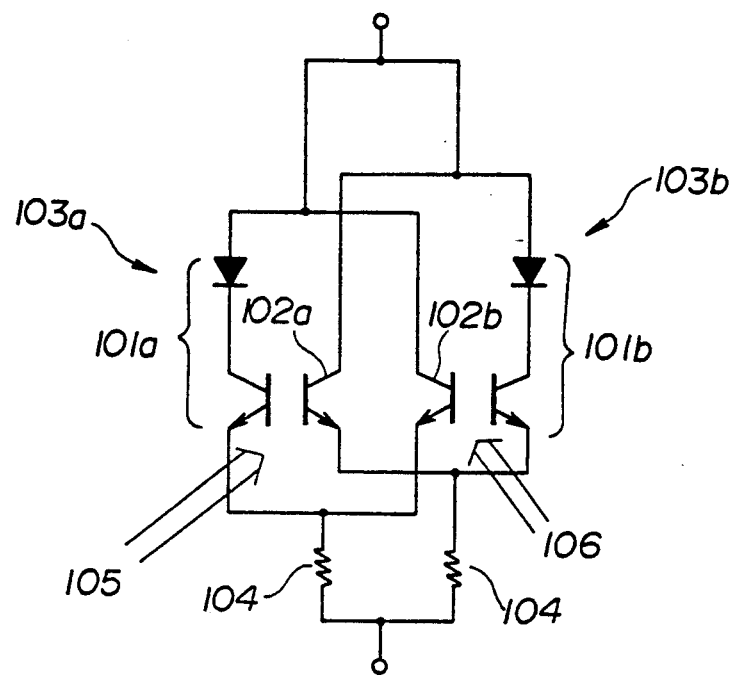
FIG. 1 is an equivalent circuit of an example of a conventional optical functional element for an EXCLUSIVE-OR operation.
Figure 2:
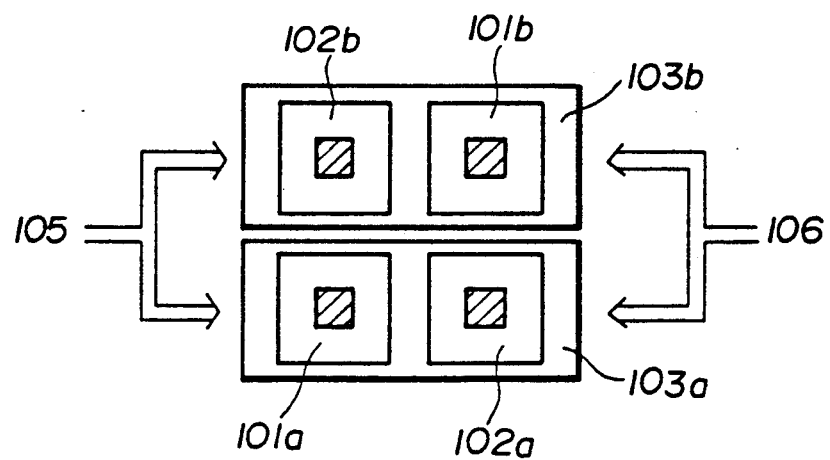
FIG. 2 is a schematic plan view of an example of a conventional optical functional element for an EXCLUSIVE-OR operation.
Figure 3:
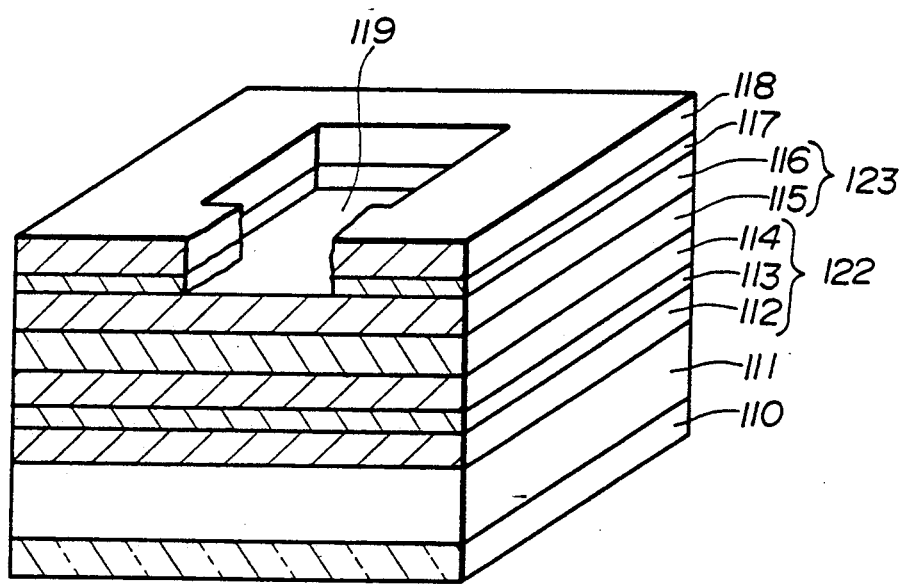
FIG. 3 is a partially cutaway view of an element structure according to the prior art.
Figure 4:
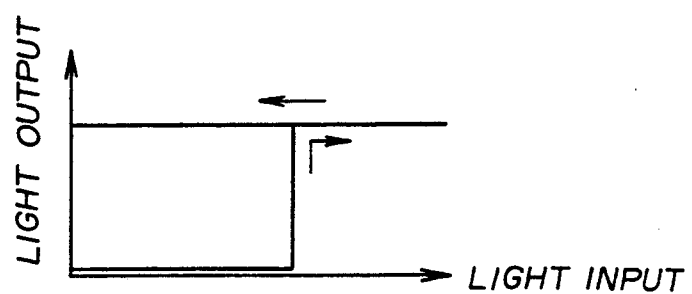
FIG. 4 is a graph showing a relationship between light input and light output for the optical functional element of FIG. 3 in an optical memory mode.

Firstly, the explanation of the operation modes of the optical functional element, which are important for the description, will be described in the following. The mode of the optical functional element is shifted in accordance with an increase of supply voltage such as, in turn, from an optical differential gain mode (shown in FIG. 6) to an optical bistable mode (shown in FIG. 5) and then to an optical memory mode (shown in FIG. 4). The mechanism and characteristics of the optical functional element as mentioned in the Japanese Laid-Open Patent Application No. 3-213833 made by the present applicant, will be explained qualitatively in the following.

Figure 5:
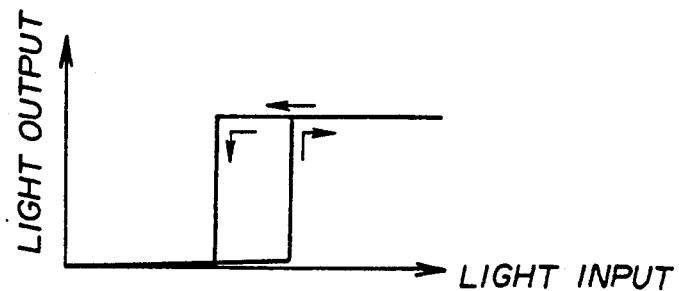
FIG. 5 is a graph showing a relationship between light input and light output for the optical functional element of FIG. 3 in an optical bistable mode.
Figure 6:
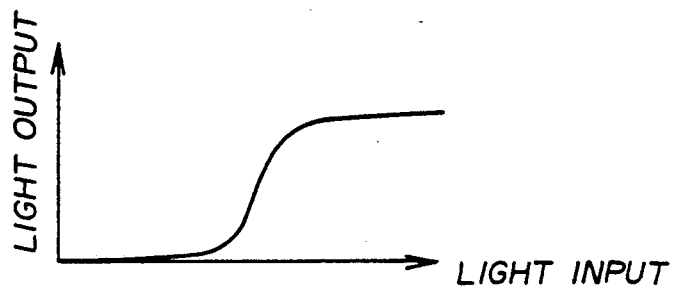
FIG. 6 is a graph showing a relationship between light input and light output for the optical functional element of FIG. 3 in an optical differential gain mode.
Figure 10:
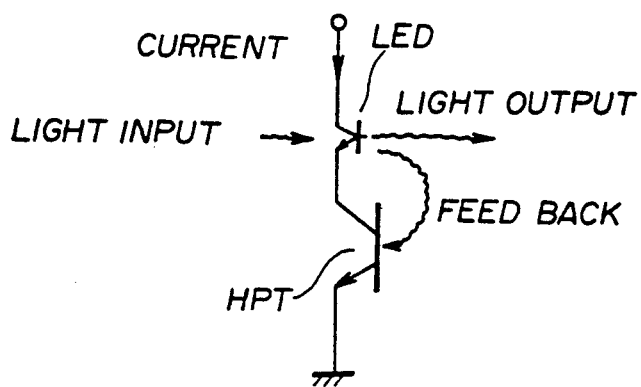
FIG. 10 is a circuit diagram showing an equivalent circuit of an optical functional element.

FIG. 10 is an equivalent circuit of an optical functional element. The optical functional element has a structure which includes a light emitting diode (LED) and heteroconjunction phototransistor (HPT) connected in series. A proportion $\beta$ ($<1$) of the light, emitted by the LED is received by the HPT. If $\beta=0$, the optical functional element functions as an optical amplifier for the light received by the HPT and emitted by the LED. If $\beta>0$ and light emitted from the LED is received by the HPT, the resistance of the HPT is decreased which causes the current of the LED to be further increased. That is, when there is input, the output of the LED tends to increase by positive feed back. As a result, the optical differential gain property, shown in FIG. 6, is obtained, and its slope (differential gain) becomes greater as the feed back rate $\beta$ is increased. Increase of the supply voltage gives approximately an equivalent effect to the increase of $\beta$ because light emission output is increased. As $\beta$ (voltage) is gradually increased, the differential gain becomes infinity and the light output is in a saturated state. In this state, the HPT can be maintained in a conducting state by the light emitted by the LED. As a result, light emission is maintained even when the light input is decreased and the element operates under the optical bistable mode having a hysteresis loop as shown in FIG. 5. If $\beta$ (voltage) is further increased, eventually, the element can be maintained in a conducting state by the light emission by the LED alone, which is the optical memory mode shown in FIG. 4.

Next, a setting method for ideal element operation of the optical EXCLUSIVE-OR element, according to the present invention, which takes advantage of the above mentioned characteristics of the optical functional element, is described.

Figure 11:
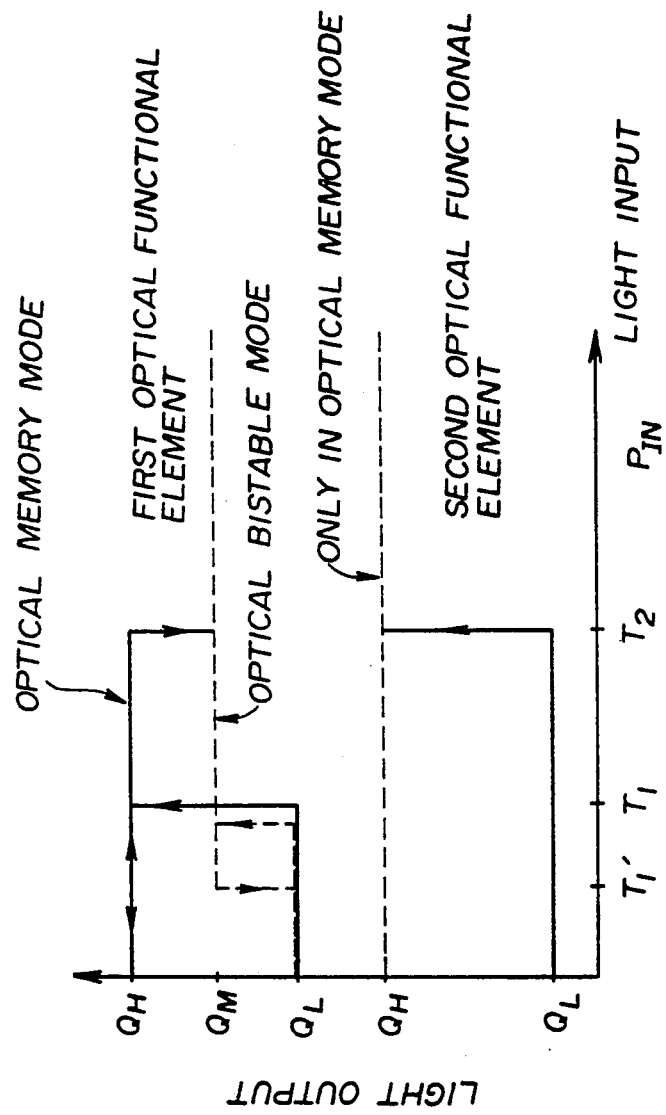
FIG. 11 is a graph for explaining the operation of the optical EXCLUSIVE-OR element according to the present invention.

In FIG. 7, in order to obtain an ideal contrast ratio of the light output emitted by the first optical functional element, a condition is established where the first optical functional element 1 is operated in the memory mode or the optical bistable mode when the second optical functional element 2 is either in the on-state or the off-state and the second optical functional element 2 is operated only in the optical memory mode. This is based on the assumption that an operation is conducted as shown in FIG. 11. That is, in FIG. 11, when the light input is $T_1 \leq 2P_{IN} \leq T_2$, the first optical functional element 1 is operated to follow the solid line, whereas it is operated to follow the dotted line when the second optical functional element 2 is turned on by light input which is $T_2 \leq 2P_{IN}$. Since the voltage of the first optical functional element 1 side is decreased when the second optical functional element 2 is turned on, the first optical functional element 1 reduces its light output and its operation is shifted to the optical bistable mode. If the light input returns to 0, the light output and current become exactly 0 ($=Q_L$). In this manner, because the contrast ratio of the output, $Q_H/Q_L$, becomes infinity, an ideal operation of EXCLUSIVE-OR is obtained.

The above operation has been confirmed by the experiment using an optical functional element with an externally attached resistor. That is, in the equivalent circuit shown in FIG. 7, each of the resistors 9, 8 and 8' is respectively set to 20Ω, 45Ω and 15Ω and the supply voltage is set to 1.55 V. Then the light input $P_{IN}$, divided by the ratio 2:1, is respectively supplied to the first optical functional element 1 and the second optical functional element 2 and the light intensity is increased and decreased.

Figures 12A, 12B:
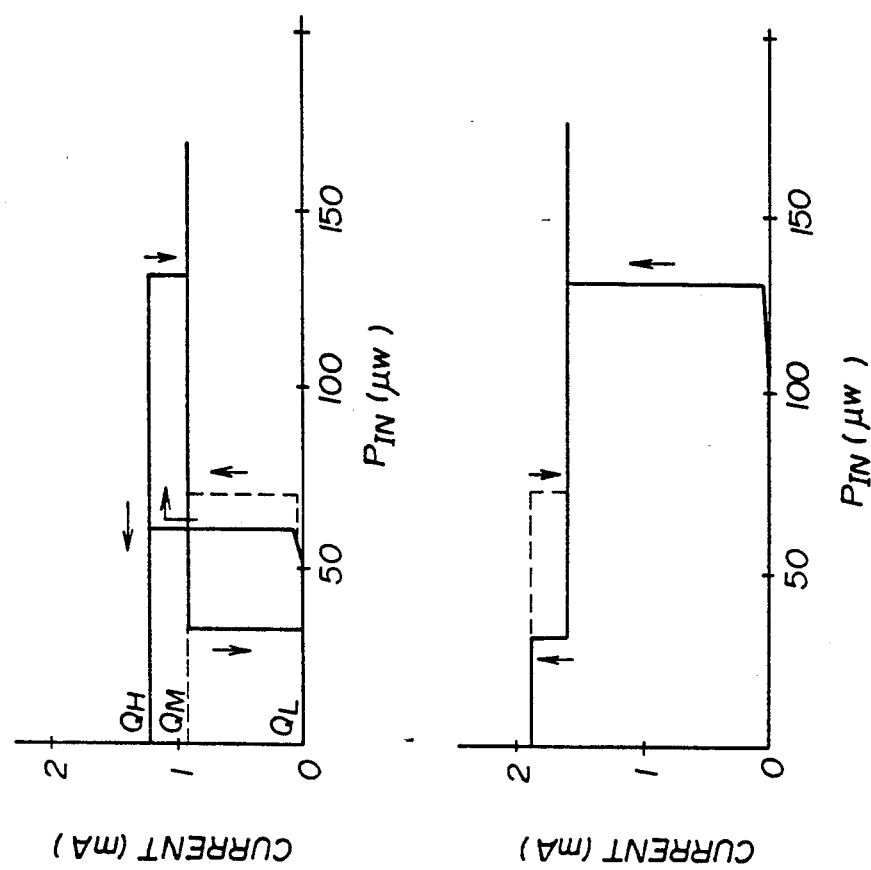
FIG. 12A is a graph showing input-output characteristics of a first optical functional element 1 and FIG. 12B is a graph showing input-output characteristics of a second optical functional element 2.

In this condition, the current flowing in the resistor 8 caused by the light input was measured and the characteristics shown in FIGS. 12A and 12B were obtained. FIG. 12A is a graph showing input-output characteristics of the first optical functional element 1 and FIG. 12B is a graph showing input-output characteristics of the second optical functional element 2. Since the light output is proportional to the current, the operational characteristics of the light input and output are known. Although a measurement has not been taken for increased light input after the light input becomes 0 when the first optical functional element 1 is in the optical bistable mode, the results were expected and indicated by the phantom line in the figure. A hysteresis shown in FIG. 12B occurs due to switching on-off of the first optical functional element 1, and is not a mode change of the element itself.

Accordingly, it was recognized that contrast ratio $Q_H/Q_L$ becomes ideal when the light input returns to 0, even though the contrast ratio is as low as nearly 1 when a middle-state $Q_M$ is set as the logic 0 state.

As mentioned above, in the optical EXCLUSIVE-OR element according to the present invention, an EXCLUSIVE-OR operation on two light beams each having different value takes advantage of a relationship between analog light input and discrete light output. In the following description the binary operator EXCLUSIVE-OR will be represented by "xor". Additionally, two values of light intensity are represented by $P_L$ and $P_H$ ($0 \leq P_L < P_H$), wherein $P_L$ corresponds to logic 0 and $P_H$ corresponds to logic 1. The light intensity of two input light beams which are used to execute an operation is respectively represented by $P_1$ and $P_2$. The two input lights are superimposed at the input-output windows 19, 20 and $2P_{IN}=P_1+P_2$ is obtained. Light input $P_{IN}$, which is divided in the above mentioned suitable ratio, is respectively input to the first and second optical functional elements 1 and 2.

When conducting an operation 0xor0 with threshold values $T_1$, $T_2$ of the optical functional elements 1 and 2, $P_{IN}=2P_L<T_1$ is established. When conducting an operation 0xor1 (1xor0), $T_1 \leq P_{IN}=P_L+P_H \leq T_2$ is established. When conducting an operation 1x or 1, $T_2 \leq P_{IN}=2P_H$ is established. In the above condition, the light output $Q_O$ (logic 0), $Q_H$ (logic 1) and $Q_L$ (logic 0) are respectively obtained from the light input-output window 19 of the optical functional element 1. Accordingly, an operation of EXCLUSIVE-OR can be performed by the optical functional element according to the present invention.

It should be noted that the optical functional element 2 performs AND because its output becomes logic 1 when the both two input lights are $P_H$ (logic 1). Accordingly, half-adder function can be performed in combination with the EXCLUSIVE-OR output of the optical functional element 1.

Next, descriptions of embodiments according to the present invention will be given with reference to drawings.

Figure 13A:
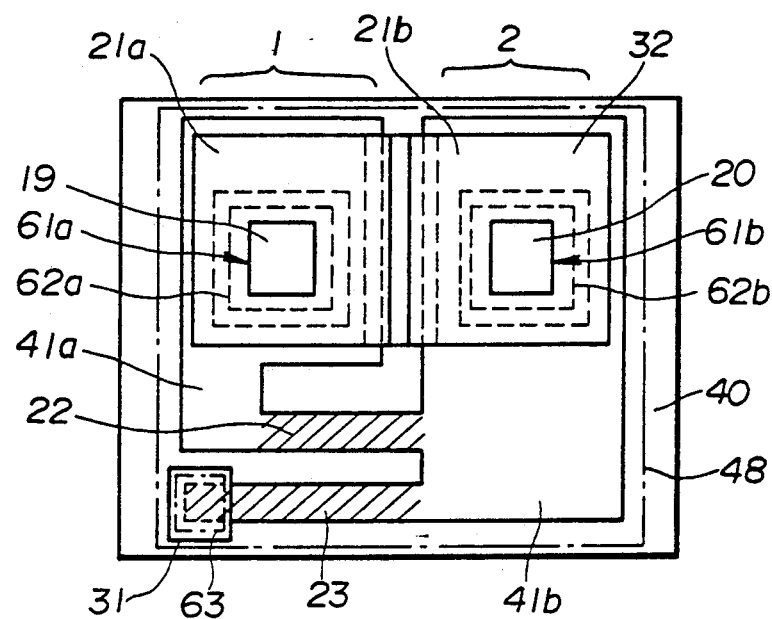
FIGS. 13A and 13B are views showing a structure of an optical EXCLUSIVE-OR element according to the present invention.
Figure 13B:
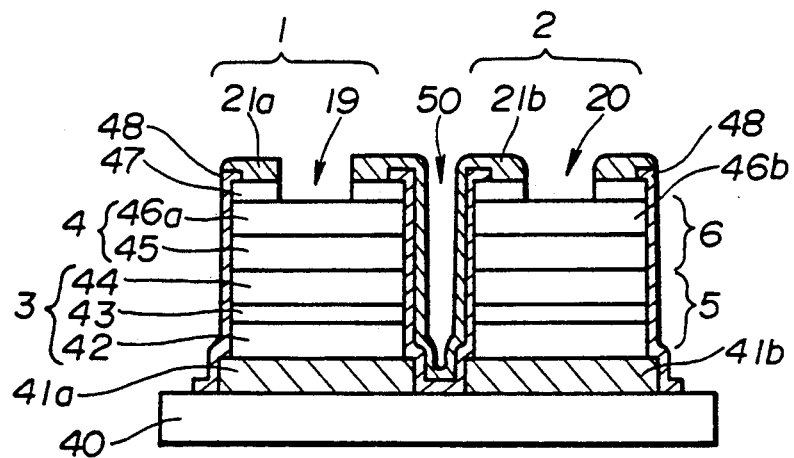

FIGS. 13A and 13B are views showing a structure of an optical EXCLUSIVE-OR element according to the present invention; FIG. 13A is a plan view; and FIG. 13B is a cross sectional view. The optical EXCLUSIVE-OR element shown in FIGS. 13A and 13B comprises the above mentioned first optical functional element 1 and second functional element 2. The first optical functional element 1 comprises the firstly formed light receiving portion 3 and the secondly formed light emitting portion 4. The second optical functional element 2 comprises the firstly formed light receiving portion 5 and the secondly formed light emitting portion 6. The light receiving portions 3 and 5, having the same layer structure as each other, comprise a resistor layer 41, an n-type Al$_X$Ga$_{1-X}$As layer 42, a p-type GaAs layer 43 and an n-type GaAs layer 44 formed, in turn, on the semiinsulating GaAs substrate 40. The light emitting portions 4 and 6, having the same layer structure as each other, comprise an n-type Al$_Y$Ga$_{1-Y}$As layer 45, a p-type Al$_Y$Ga$_{1-Y}$As layer 46, a p-type GaAs layer 47 and a p-type ohmic electrode 21 respectively formed, in turn, on the light receiving portions 3 and 5. The groove 50, whose bottom surface reaches to the top surface of the substrate 40, is formed between the first and the second optical functional elements 1 and 2. An insulating layer 48 is formed on both side surfaces of the groove 50, a top surface of the resistor layer 41 and the top surface of the substrate 40. In FIG. 13A, the insulating layer 48 is indicated by a single dashed line.

As shown in FIG. 13A, each resistor layer 41a and 41b has an area wider than the semiconductor layer situated on the resistor layer and is connected to the other by the belt-like resistor region having a resistance fixed to a value somewhere between 0 and 100Ω. A similar belt-like resistor region 23 is formed extending from the resistor layer 41b, and a first electrode 31 is provided on a surface of the end of the resistor region 23. A hole 63 is provided to a portion of the insulating layer 48 positioned over the end of the resistor layer 23 and the first electrode 31 makes contact with the end of the resistor region 23. Further, a second electrode 32 is provided over the insulating layer 48 excluding a portion having the resistor layer 41 underneath and the first and the second optical functional elements 1 and 2. The second electrode 32 make contact with the p-type GaAs layer 47 and includes light input-output windows 19 and 20 in which the p-type Al$_Y$Ga$_{1-Y}$As layers 46a and 46b are respectively exposed to the outside.

It should be noted that the composition X and Y in the AlGaAs layer of the embodiment is X=Y=0.4. However, X and Y may be determined in a range with a relationship of $0.2 \leq X \leq Y \leq 0.5$.

Next, a description of a manufacturing method of the optical EXCLUSIVE-OR element of the first embodiment will be given with reference to FIGS. 13A to 16.

Figure 14:
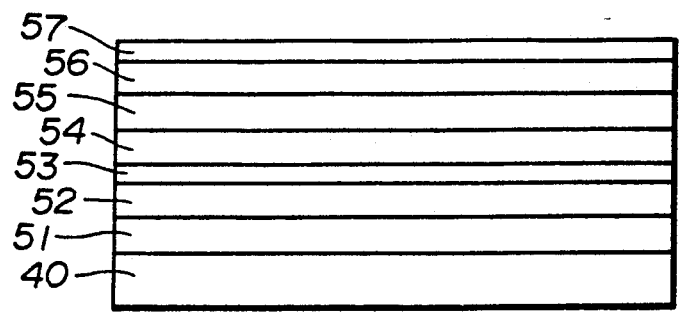
FIG. 14 is a cross sectional view for explaining a manufacturing process of the optical EXCLUSIVE-OR element of the first embodiment according to the present invention.

First, as shown in FIG. 14, by using an MOCVD method, a low doped n-type GaAs layer 51 having a thickness of 1 μm, an n-type Al$_{0.4}$Ga$_{0.6}$As layer 52 having a thickness of 1 μm, a p-type GaAs layer 53 having a thickness of 0.1 μm, an n-type GaAs layer 54 having a thickness of 1 μm, an n-type Al$_{0.4}$Ga$_{0.6}$As layer 55 having a thickness of 1 μm, a p-type Al$_{0.4}$Ga$_{0.6}$As layer 56 having a thickness of 1 μm, and a p-type GaAs layer 57 having a thickness of 0.2 μm are, in turn, formed on the semi-insulating GaAs substrate 40.

Figure 15:
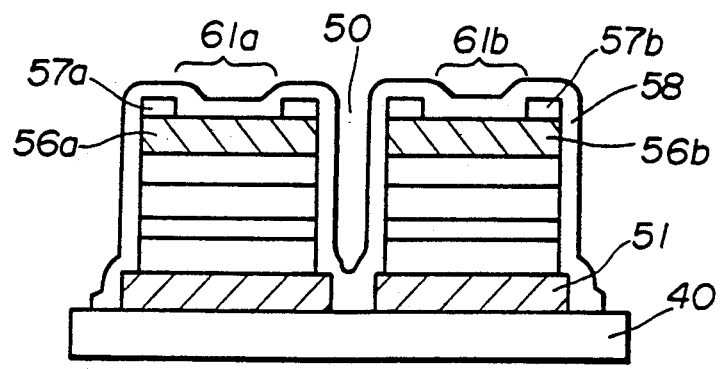
FIG. 15 is a cross sectional view for explaining a manufacturing process of the optical EXCLUSIVE-OR element of the first embodiment according to the present invention.
Figure 16:
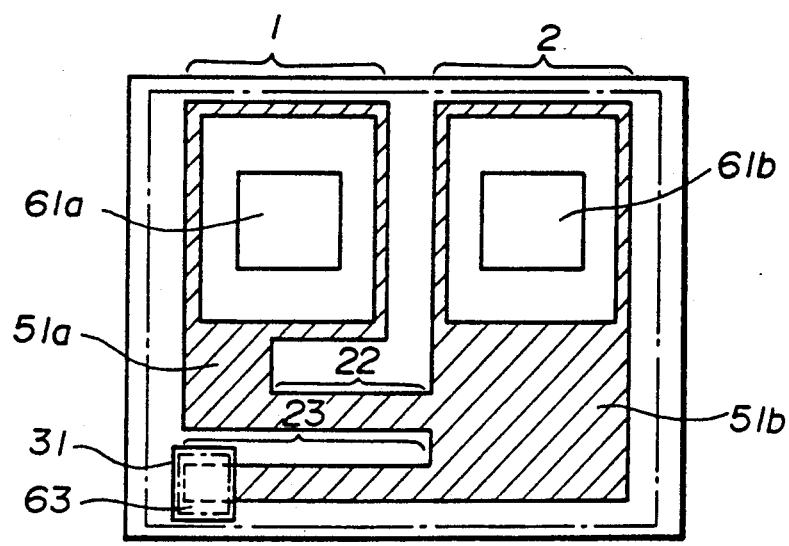
FIG. 16 is a plan view for explaining a manufacturing process of the optical EXCLUSIVE-OR element of the first embodiment according to the present invention.

Second, as shown in FIG. 15, by using a RIBE method, the groove 50 is formed so that the separated first and second optical functional elements 1 and 2 are formed. Then the element is etched so that the resistor layer 51 remains in the shape like the shaded area shown in FIG. 16. In this process, the etching is performed so that the resistor layers 51a and 51b respectively underneath the first and the second optical functional elements 1 and 2 are connected to each other by the belt-like resistor region 22. Additionally, an etching is also performed so that the resistor region 23, on which the first electrode 31 is formed in the following process, is formed to extend from the resistor layer 51b. After that, rectangular-shaped light input-output windows 61a and 61b, which reach to the top surfaces of the p-type Al$_{0.4}$Ga$_{0.6}$As layers 56a and 56b, are respectively formed by etching the p-type GaAs layer 57a and 57b.

Third, after forming an insulating layer 58 over the entire element, square openings 62a and 62b having a side of 80 μm are formed on the insulating layer 58 which is made of SiO$_2$ on the first and the second optical functional elements 1 and 2. Through the openings 62a, 62b, the p-type Al$_{0.4}$Ga$_{0.6}$As layers 56a and 56b are exposed. At the same time, a contact hole 63, through which the resistor layer 51 is exposed, is formed by etching the SiO$_2$ insulating layer 58 on the top surface of the resistor layer 51 in the shape of a square.

Lastly, as shown in FIGS. 13A and 13B, the p-type ohmic electrode (Cr/Au electrode) 21 and the n-type ohmic electrode (AuGe/Ni/Au electrode) 31 are formed as positive electrodes on the opening 61 and the contact hole 63 respectively. Then the square light input-output windows 19 and 20 are formed by etching the SiO$_2$ insulating layer 48 (58 in FIG. 14) inside the opening 62 so as to expose each of the p-type Al$_{0.4}$Ga$_{0.6}$As layers 46a and 46b, and the manufacturing process ends.

Figure 17:
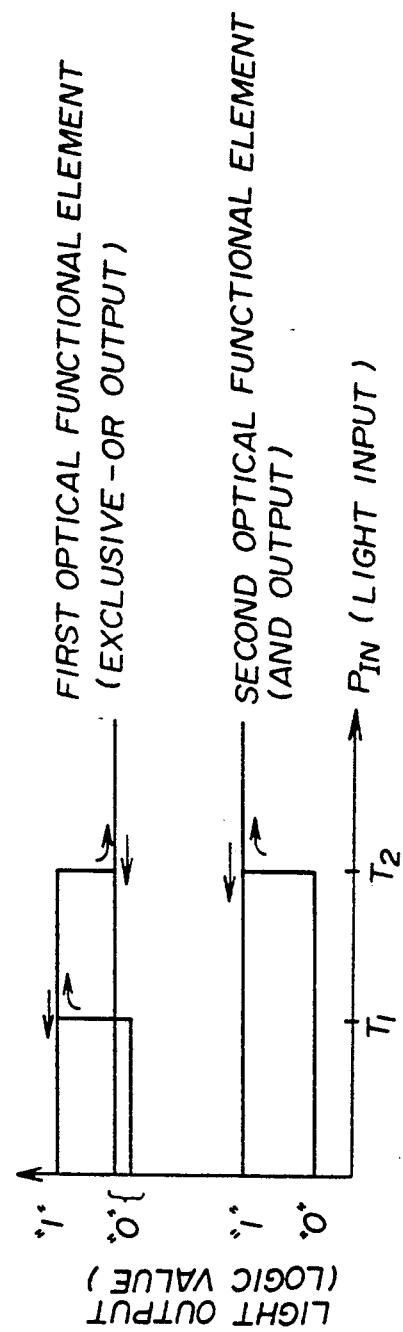
FIG. 17 is a graph showing input-output characteristics of the element in the optical memory mode.

FIG. 17 is a graph showing input-output characteristics of the element in the optical memory mode set by adjusting the supply voltage. In FIG. 17, the horizontal axis represents intensity of input light and the vertical axis represents relative value of intensity of output light indicated by logic "0" and "1". A voltage is supplied to the electrodes of the element, and light having a wavelength corresponding to an energy gap of Al$_{0.4}$Ga$_{0.6}$As layer 55 (56) is used as an input light. Two input lights P$_A$ and P$_B$ are optically combined outside the element and an addition 2P$_{IN}$=P$_A$+P$_B$ is performed. Then the combined light 2P$_{IN}$ is divided by a predetermined ratio P$_1$>P$_2$ (P$_1$+P$_2$=2P$_{IN}$) so that the threshold values T$_1$ and T$_2$, different in the first optical functional element 1 and the second optical functional element 2 is T$_1$<T$_2$ when both P$_A$ and P$_B$ are logic 1. If both P$_A$ and P$_B$ are logic 0, threshold value T$_1$ is not reached which results in the first and the second optical functional elements being in the off-state. If either P$_A$ or P$_B$ is logic 1, the threshold value T$_1$ is reached and results in only the first optical functional element 1 being turned on. If both P$_A$ and P$_B$ are logic 1, threshold value T$_2$ is reached which results in the second optical functional element also being turned on. Due to this event, the voltage between the end terminals of the first optical functional element 1 including the load resistor 8 drops and the first optical functional element 1 becomes logic 0.

In this manner, a result of EXCLUSIVE-OR is obtained from the light input-output window 19 of the first optical functional element 1. Additionally, since an output of AND is obtained from the second optical functional element 2, the function of a half-adder is realized in combination with the output of the first optical functional element 1.

Next, a description will be given of a second embodiment of the present invention with reference to FIG. 18.

Figure 18:
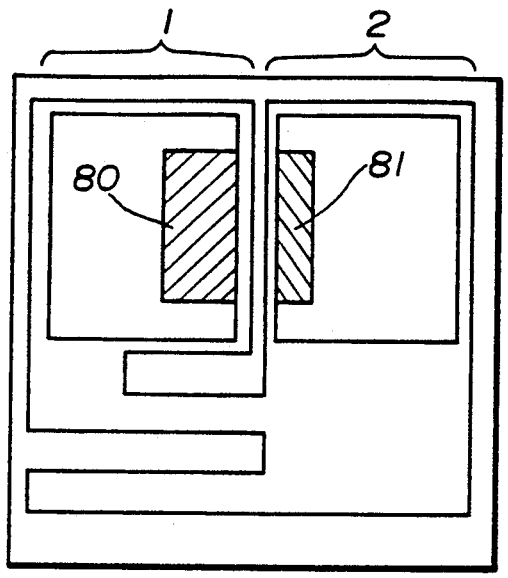
FIG. 18 is a plan view showing a structure of an optical EXCLUSIVE-OR element of the second embodiment according to the present invention.

FIG. 18 is a plan view showing a structure of an optical EXCLUSIVE-OR element of the second embodiment according to the present invention. Although the layer structure is the same as that in the first embodiment, the positions of the light input-output windows 80 and 81 are different. Compared to the positions of the windows 61a and 61b of the first embodiment of FIG. 16, the light input-output windows 80 and 81 are moved toward the boundary between the first and the second optical functional elements 1 and 2, and the light input-output window 81 of the second optical functional element 2 is smaller than the light input-output window 80 of the first optical functional element 1. This is to take an advantage of the threshold value being inversely proportional to the area of the window when a light having a spot diameter greater than the area of the respective window is supplied. According to this embodiment, two input lights are combined at a position directly above the element and then the combined light is incident upon the elements such that the center of the light spot coincides with the boundary of the two windows 80 and 81. By this operation, the light having intensity determined by the ratio of the areas of the windows 80 and 81 is incident upon each of the optical functional elements 1 and 2, and the difference affects the threshold values. As a result, since the input light is incieent on the assumption that the pair of light input-output windows 80 and 81 acts as a single window, an external optical system can be simplified.

Next, a description of a third embodiment of the present invention will be given with reference to FIG. 19.

Figure 19:
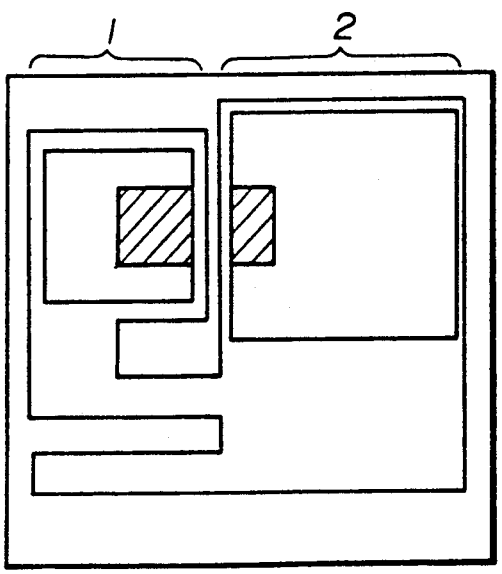
FIG. 19 is a plan view showing a structure of an optical EXCLUSIVE-OR element of the third embodiment according to the present invention.

FIG. 19 is a plan view showing a structure of an optical EXCLUSIVE-OR element of the third embodiment according to the present invention. Although the layer structure is the same as that in the first embodiment, areas in horizontal planes of the first optical functional element 1 and the second optical functional element 2 are different from each other. As a result, the element is asymmetric. If the area of the first optical functional element is smaller than that of the second optical functional element, current tends to flow to the second optical functional element when both elements are on-state. Accordingly, a greater contrast ratio $Q_H/Q_L$ can be obtained in a EXCLUSIVE-OR operation, where $Q_H$ is the logic 1 light output of 0xor1 (1xor0) and $Q_L$ is the logic 0 light output of 1xor1.

It should be noted that, as previously mentioned, an ideal contrast can be obtained by improving the method of use without such improvements in the element. Therefore, further improvement of the operation of the element can be obtained by the combination of the above mentioned element structure and its improved method of use.

Next, a description of a fourth embodiment of the present invention will be given with reference to FIG. 20.

Figure 20:
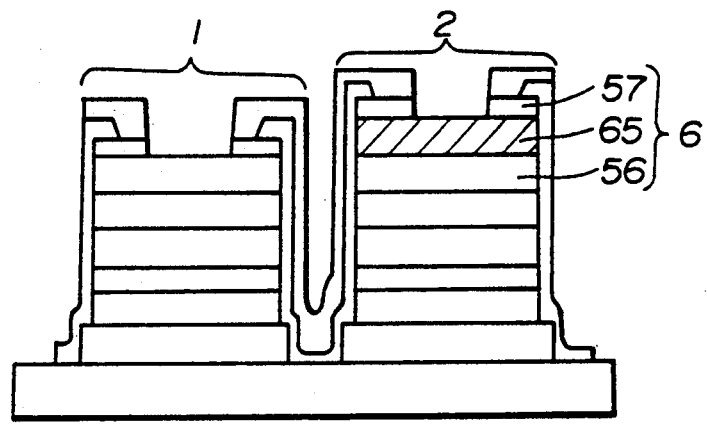
FIG. 20 is a cross sectional view showing a structure of an optical EXCLUSIVE-OR element of the fourth embodiment according to the present invention.

FIG. 20 is a cross sectional view showing a structure of an optical EXCLUSIVE-OR element of the fourth embodiment according to the present invention. In this embodiment, a $Al_ZGa_{1-Z}As$ layer (absorbing layer, $0.1 \leq Z \leq 0.2$) 65 having a thickness of 1 μm is provided between the layer 56 and the layer 57 of the second optical functional element 2. According to this structure, the layer 65 becomes opaque to light of the wavelength emitted by the light emitting portion 6. However, by using light having a wavelength corresponding to the energy gap of GaAs as input light, the layer becomes transparent to the input light. Accordingly, only the light output of an EXCLUSIVE-OR emitted by the first optical functional element is obtained. As a result, a separation of light outputs is performed, which is performed by an external optical system in the conventional technique, when the AND output by the second optical functional element 2 is not necessary and can be eliminated.

Next, a description of a fifth embodiment of the present invention will be given with reference to FIG. 21.

Figure 21:
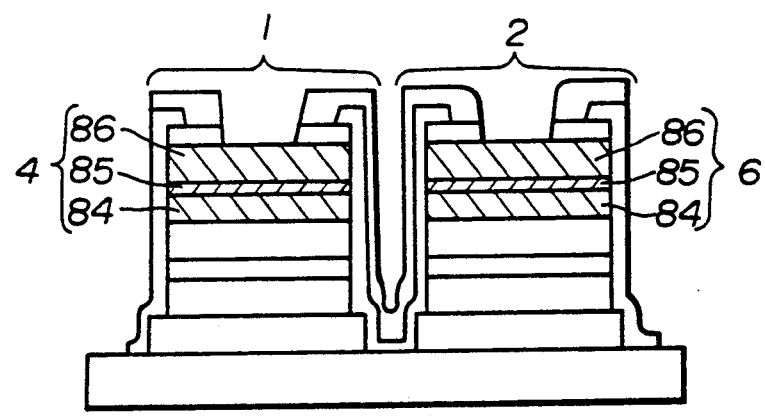
FIG. 21 is a cross sectional view showing a structure of an optical EXCLUSIVE-OR element of the fifth embodiment according to the present invention.

FIG. 21 is a cross sectional view showing a structure of an optical EXCLUSIVE-OR element of the fifth embodiment according to the present invention. In this embodiment, each of the light emitting portions 4 and 6 of the first and the second optical functional elements 1 and 2 is made of a double-hereto-structure light emitting diode comprising an n-type $Al_{0.6}Ga_{0.4}As$ layer 84 having a thickness of 1 μm, an $Al_{0.4}Ga_{0.6}As$ layer 85 having a thickness of 1 μm, and a p-type $Al_{0.6}Ga_{0.4}As$ layer 86 having a thickness of 1 μm. This diode has a higher light emitting efficiency compared to a pn-junction type light emitting diode. Therefore, the first optical functional element 1 can operate under a lower input light, and an optical EXCLUSIVE-OR element which can emit higher light output is obtained.

Next, a description of a sixth embodiment of the present invention will be given with reference to FIG. 22.

Figure 22:
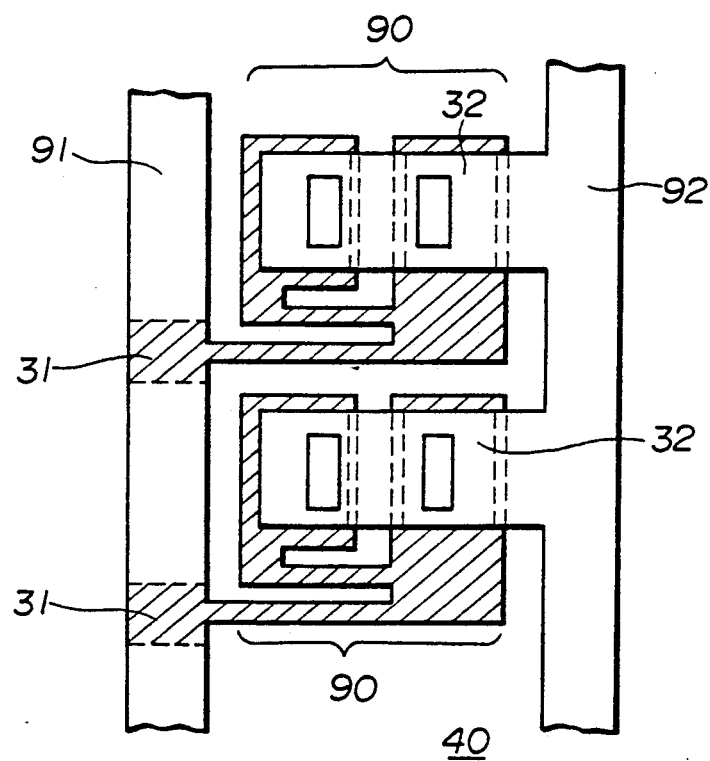
FIG. 22 is a plan view showing a structure of an optical EXCLUSIVE-OR element of the sixth embodiment according to the present invention.

FIG. 22 is a plan view showing a structure of an optical EXCLUSIVE-OR element of the sixth embodiment according to the present invention. In this embodiment, a plurality of elements according to the second embodiment are integrated on the semiinsulating semiconductor substrate 40 to make a one-dimensional or two-dimensional array. Although FIG. 22 shows a one-dimensional array, a two-dimensional array can be formed by arranging a plurality of one-dimensional arrays. In FIG. 22, a plurality of optical EXCLUSIVE-OR elements 90 are aligned on the semiinsulating semiconductor 40. A first electrode bus line 91 and a second electrode bus line 92 are respectively formed on either sides of the elements. Each optical functional element 90 is connected to both of the first and the second electrode bus line 91 and 92. According to this array structure, it is possible to perform an EXCLUSIVE-OR of two two-dimensional pictures, for example detection of differences between two pictures can be performed.

The present invention is not limited to the specifically disclosed embodiments, and variations and modifications may be made without departing from the scope of the present invention.

What is claimed is:

1. An optical EXCLUSIVE-OR element comprising:
   a substrate;
   a first optical functional element formed on said substrate, having a light receiving portion receiving an input light and a light emitting portion emitting an output light, said light emitting portion being formed on said light receiving portion, said light emitting portion comprising semiconductor materials having an energy gap wider than a dominant peak energy of said input light, said light receiving portion comprising semiconductor materials having an energy gap equal to or narrower than said dominant peak energy of said input light, a relationship between said input light and said output light being non-linear because of an optical feed back effect due to absorption of a portion of said output light emitted by said light emitting portion by said light receiving portion;
   a second optical functional element formed in a position adjacent to said first optical functional element on said substrate, having the same structure as said first optical functional element; and
   a first electrode formed over said first and second optical functional elements, having windows which allow said input light and output light to pass through, each of said windows being formed at a position corresponding to a top surface of each of said first and second optical functional elements.

2. The optical EXCLUSIVE-OR element as claimed in claim 1, further comprising a resistor layer formed on said substrate, connecting said first optical functional element and said second optical functional element.

3. The optical EXCLUSIVE-OR element as claimed in claim 1, wherein each of said windows has a predetermined size, so that each of said windows serves as an iris for said input light.

4. The optical EXCLUSIVE-OR element as claimed in claim 2, wherein each of said windows has a predetermined size, so that each of said windows serves as an iris for said input light.

5. The optical EXCLUSIVE-OR element as claimed in claim 1, further comprising an insulating layer formed between said first and second optical functional elements and said electrode so that said first and second optical functional elements are electrically insulated from each other.

6. The optical EXCLUSIVE-OR element as claimed in claim 2, further comprising a second electrode formed on said substrate, and wherein said resistor layer comprises portions located underneath said first and second optical functional elements, a first resistor region having a predetermined resistance and connecting said portions of said resistor layers to each other, and a second resistor region having a predetermined resistance, said second resistor region being connected to said second electrode.

7. The optical EXCLUSIVE-OR element as claimed in claim 6, wherein said first resistor region has a resistance less than 100Ω and said second resistor region has a resistance less than 100Ω.

8. The optical EXCLUSIVE-OR element as claimed in claim 1, wherein each of said windows is formed in contact with a side face opposite an adjacent optical functional element, and each of said windows has a respective predetermined size.

9. The optical EXCLUSIVE-OR element as claimed in claim 1, wherein said second optical functional element further comprises an absorbing layer formed on a top surface, said absorbing layer being opaque to said output light emitted by said light emitting portion and being transparent to said input light.

10. The optical EXCLUSIVE-OR element as claimed in claim 1, wherein said light emitting portion of each of said first and second optical functional elements comprises a double-hetero-structure light emitting diode.

11. The optical EXCLUSIVE-OR element as claimed in claim 2, further comprising a first electrode bus line and a second electrode bus line, and said first electrode being connected to said first electrode bus line and said resistor layer being connected to said second electrode bus line.

12. The optical EXCLUSIVE-OR element as claimed in claim 1, wherein;
said substrate comprises a semi-insulating semiconductor;
each of said light receiving portions of said first and second optical functional elements comprises a resistor layer having an energy gap the same as said substrate, an emitter layer comprising a first conduction-type semiconductor layer having an energy gap wider than that of the resistor layer, a base layer comprising a second conduction-type semiconductor layer having an energy gap narrower than that of said emitter layer, and a collector layer comprising the first conduction-type having an energy gap the same as that of the base layer, formed in turn on said substrate; and
each of said light emitting portions of said first and second optical functional elements comprises a first layer comprising the first conduction-type having an energy gap wider than that of said substrate and a second layer comprising the second conduction-type having an energy gap the same as that of said first layer, formed in turn on said light receiving portions.

13. The optical EXCLUSIVE-OR element as claimed in claim 12, wherein said emitter layer comprises an n-type $Al_XGa_{1-X}As$ layer, said base layer comprises a p-type GaAs layer, said collector layer comprises an n-type GaAs layer, said first layer comprises an n-type $Al_YGa_{1-Y}As$ layer, and said second layer comprises a p-type $Al_YGa_{1-Y}As$ layer, where X and Y satisfy $0.2 \leq X \leq Y \leq 0.5$.

14. The optical EXCLUSIVE-OR element as claimed in claim 12, wherein said emitter layer comprises a p-type $Al_XGa_{1-X}As$ layer, said base layer comprises an n-type GaAs layer, said collector layer comprises a p-type GaAs layer, said first layer comprises a p-type $Al_YGa_{1-Y}As$ layer, and said second layer comprises an n-type $Al_YGa_{1-Y}As$ layer, where X and Y satisfy $0.2 \leq X \leq Y \leq 0.5$.

15. The optical EXCLUSIVE-OR element as claimed in claim 9, wherein said absorbing layer comprises an $Al_ZGa_{1-Z}As$ layer, where Z satisfies $0.1 \leq Z \leq 0.2$.

* * * * *